United States Patent
Fukuda et al.

(10) Patent No.: US 11,641,009 B2
(45) Date of Patent: May 2, 2023

(54) LIGHT-EMITTING DEVICE

(71) Applicants: NATIONAL INSTITUTE OF ADVANCED INDUSTRIAL SCIENCE AND TECHNOLOGY, Tokyo (JP); PHOENIX ELECTRIC CO., LTD., Himeji (JP); NATIONAL INSTITUTE FOR MATERIALS SCIENCE, Tsukuba (JP)

(72) Inventors: Takashi Fukuda, Tsukuba (JP); Tetsuya Gouda, Himeji (JP); Yuta Sakimoto, Himeji (JP); Naoto Hirosaki, Tsukuba (JP); Kohsei Takahashi, Tsukuba (JP)

(73) Assignees: NATIONAL INSTITUTE OF ADVANCED INDUSTRIAL SCIENCE AND TECHNOLOGY, Tokyo (JP); PHOENIX ELECTRIC CO., LTD., Himeji (JP); NATIONAL INSTITUTE FOR MATERIALS SCIENCE, Tsubaka (JP)

(*) Notice: Subject to any disclaimer, the term of this patent is extended or adjusted under 35 U.S.C. 154(b) by 0 days.

(21) Appl. No.: 16/972,947

(22) PCT Filed: Jun. 12, 2019

(86) PCT No.: PCT/JP2019/023203
§ 371 (c)(1),
(2) Date: Dec. 7, 2020

(87) PCT Pub. No.: WO2019/240150
PCT Pub. Date: Dec. 19, 2019

(65) Prior Publication Data
US 2021/0249569 A1    Aug. 12, 2021

(30) Foreign Application Priority Data

Jun. 12, 2018 (JP) .............................. JP2018-111551
Nov. 12, 2018 (JP) .............................. JP2018-211960

(51) Int. Cl.
*H01L 33/50* (2010.01)
*C09K 11/77* (2006.01)
(Continued)

(52) U.S. Cl.
CPC ...... *H01L 33/504* (2013.01); *C09K 11/77927* (2021.01); *H01L 27/322* (2013.01);
(Continued)

(58) Field of Classification Search
CPC ... H01L 33/504; H01L 27/322; H01L 33/505; H01L 51/5012; H01L 51/005;
(Continued)

(56) References Cited

U.S. PATENT DOCUMENTS

2004/0256974 A1* 12/2004 Mueller-Mach ... C09K 11/7774
313/485
2009/0231874 A1    9/2009 Kishimoto et al.
(Continued)

FOREIGN PATENT DOCUMENTS

CN    103022328 B    6/2016
EP    3 431 569 A1    1/2019
(Continued)

OTHER PUBLICATIONS

Sep. 10, 2019 International Search Report issued in International Patent Application No. PCT/JP2019/023203.
(Continued)

*Primary Examiner* — Kevin Quarterman
(74) *Attorney, Agent, or Firm* — Oliff PLC

(57) ABSTRACT

A light-emitting device including a solid-state light source that emits light having a peak wavelength in the range of 480 nm or less and a fluorescent film that covers the solid-state light source and includes at least one kind of phosphor, wherein the fluorescent film includes at least one kind of near-infrared phosphor that is excited by light from the
(Continued)

solid-state light source, has a peak wavelength in the range exceeding 700 nm, and has an emission spectrum with a full width at half maximum of 100 nm or more in a range including the peak wavelength.

12 Claims, 8 Drawing Sheets

(51) Int. Cl.
    *H01S 5/00*     (2006.01)
    *H01L 27/32*     (2006.01)
    *H05B 33/14*     (2006.01)

(52) U.S. Cl.
    CPC .......... *H01L 33/505* (2013.01); *H01S 5/0087* (2021.01); *H05B 33/14* (2013.01)

(58) Field of Classification Search
    CPC ..... H01L 33/502; H01L 33/507; H01L 51/50; C09K 11/77927; C09K 11/584; C09K 11/7734; C09K 11/7789; H05B 33/14; H05B 33/12; H01S 5/0087
    See application file for complete search history.

(56) References Cited

U.S. PATENT DOCUMENTS

| | | |
|---|---|---|
| 2010/0213821 A1 | 8/2010 | Masuda et al. |
| 2011/0260194 A1 | 10/2011 | Fuchi et al. |
| 2013/0119280 A1 | 5/2013 | Fuchi et al. |
| 2013/0127329 A1* | 5/2013 | Komada ................ H05B 45/20 313/498 |
| 2014/0374780 A1* | 12/2014 | Schaefer ............... H01L 33/507 257/88 |
| 2015/0228868 A1* | 8/2015 | Ouderkirck ............... F21V 7/04 362/84 |
| 2017/0331065 A1* | 11/2017 | Seo ..................... H01L 51/0089 |
| 2017/0342322 A1* | 11/2017 | Suzuki ............... C09K 11/7774 |
| 2019/0071600 A1 | 3/2019 | Ozawa et al. |
| 2020/0048549 A1 | 2/2020 | Hong |

FOREIGN PATENT DOCUMENTS

| | | |
|---|---|---|
| JP | 2009-224053 A | 10/2009 |
| JP | 2015-130459 A | 7/2015 |
| JP | 2017-214442 A | 12/2017 |
| WO | 2010/055831 A1 | 5/2010 |
| WO | 2017/159175 A1 | 9/2017 |
| WO | 2018/207703 A1 | 11/2018 |

OTHER PUBLICATIONS

Feb. 1, 2022 Extended European Search Report issued in European Application No. 19818988.8.

V.P. Dotsenko et al., "Influence of Ce3+ Ions on the Near Infrared Emission of Eu2+-doped Ca3Sc2Si3O12", Journal of Nano- And Electronic Physics, vol. 7, No. 2, 02041 (5pp), Jun. 10, 2015.

* cited by examiner (A)

(B)

LIGHT-EMITTING DEVICE

TECHNICAL FIELD

The present invention relates to a light-emitting device.

BACKGROUND

In recent years, replacing various types of lighting, including household lighting, from halogen lamps to light-emitting diodes (LEDs) has been rapidly progressing, and it has become possible to achieve long life and miniaturization. However, halogen lamps are still predominantly used as light sources for industrial equipment such as spectroscopic analyzers, and replacement by LEDs has not progressed. A major cause thereof is that with conventional LEDs, it is considered difficult to satisfy characteristics demanded of light sources for industrial equipment, such as a stable emission spectrum distribution being exhibited across a wide bandwidth and a wavelength shift due to temperature change not readily occurring. Patent Document 1 discloses a multilayer film sheet for a light-emitting device, the multilayer film sheet including two or more phosphors including a red phosphor and a green phosphor, wherein: one kind of phosphor is included in each phosphor layer; and by arranging phosphor layers in an order from a phosphor layer including a phosphor having a long emission wavelength to a phosphor layer including a phosphor having a short emission wavelength, the total luminous flux of the light-emitting device is increased.

CITATION LIST

Patent Literature

Patent Document 1: JP 2015-130459 A

SUMMARY OF INVENTION

Technical Problem

However, since the objective of conventional light-emitting devices was an application to an illumination use, the peak wavelength of a high wavelength end thereof is 700 nm or less and is not sufficient as a light source for industrial equipment for which emission of light also having a peak wavelength in the near-infrared region exceeding 700 nm is demanded.

The present invention addresses the problem of providing a light-emitting device which, due to excitation by light from a light source, at least has a peak wavelength in the region exceeding 700 nm.

Solution to Problem

The present invention relates to the following.
(1) A light-emitting device comprising at least a solid-state light source that emits light having a peak wavelength in the range of 480 nm or less and a fluorescent film that covers the solid-state light source and includes at least one kind of phosphor, wherein the fluorescent film includes at least one kind of near-infrared phosphor that is excited by light from the solid-state light source and emits light having a peak wavelength in the range exceeding 700 nm and having an emission spectrum with a full width at half maximum of 100 nm or more in a range including the peak wavelength.

(2) The light-emitting device according to (1), having a continuous emission spectrum at least in the range of 400 nm or more to 1,000 nm or less.
(3) The light-emitting device according to (1) or (2), wherein the fluorescent film further includes at least one kind of visible phosphor that is excited by light from the solid-state light source and emits light having a peak wavelength in the range of 350 nm or more to 700 nm or less.
(4) The light-emitting device according to (3), wherein the fluorescent film includes, as the visible phosphor, one or more kinds of each of: a visible phosphor A that is excited by light from the solid-state light source and emits light having a peak wavelength in the range of 350 nm or more to less than 430 nm; a visible phosphor B that is excited by light from the solid-state light source and emits light having a peak wavelength in the range of 430 nm or more to less than 500 nm; and a visible phosphor C that is excited by light from the solid-state light source and emits light having a peak wavelength in the range of 500 nm or more to 700 nm or less.
(5) The light-emitting device according to (4), wherein the fluorescent film is formed with two or more layers and the visible phosphors A and B are included in different layers.
(6) The light-emitting device according to (4) or (5), wherein: the fluorescent film is formed with two or more layers each having a different kind of phosphor included therein; and the two or more layers are laminated, in the traveling direction of light from the solid-state light source, in an order from a layer including a phosphor having a longer peak wavelength to a layer including a phosphor having a shorter peak wavelength.
(7) The light-emitting device according to (5) or (6), wherein each layer of the fluorescent film includes one or more and three or less kinds of phosphors.
(8) The light-emitting device according to (4), wherein the fluorescent film has, on a same surface, two or more regions each having a different kind of phosphor included therein.
(9) The light-emitting device according to (8), wherein the two or more regions each having a different kind of phosphor have at least a region including the near-infrared phosphor and a region including the visible phosphor.
(10) The light-emitting device according to any one of (1) to (9), comprising two or more solid-state light sources.
(11) The light-emitting device according to any one of (1) to (10), wherein the solid-state light source is at least one selected from a light-emitting diode, a laser diode, and an organic electroluminescent light-emitting element.
(12) The light-emitting device according to any one of (1) to (11), wherein the near-infrared phosphor includes divalent europium ions.
(13) The light-emitting device according to any one of (1) to (12), wherein the near-infrared phosphor has a composition represented by formula (I) below $$Li_aSr_bLa_cSi_dN_eEu_f \qquad (I)$$

wherein a-f are numbers satisfying: $a+b+c+d+e+f=100$; and $0 \leq a \leq 8.22$, $0.22 \leq b \leq 17.33$, $1.12 \leq c \leq 11.36$, $22.41 \leq d \leq 38.09$, $49.47 \leq e \leq 56.09$, and $0.88 \leq f \leq 1.01$.
(14) A fluorescent film including: at least one kind of near-infrared phosphor that, due to light having a peak wavelength in the range of 480 nm or less, emits light having a peak wavelength in the range exceeding 700 nm and having an emission spectrum with a full width at a half maximum of 100 nm or more in a range including the peak wavelength; and at least one kind of visible phosphor that, due to the light, emits light having a peak wavelength in the range of 350 nm or more to 700 nm or less.

Effects of Invention

The present invention makes it possible to provide a light-emitting device which, due to excitation by light from a light source, at least has a peak wavelength in the region exceeding 700 nm.

DESCRIPTION OF EMBODIMENTS

Hereinafter, one embodiment of the present invention will be described in detail. The present invention is not limited to the following embodiment and can be implemented with modifications, as appropriate, within a scope not inhibiting the effects of the present invention.

First Embodiment

Light-Emitting Device

Figure 1:
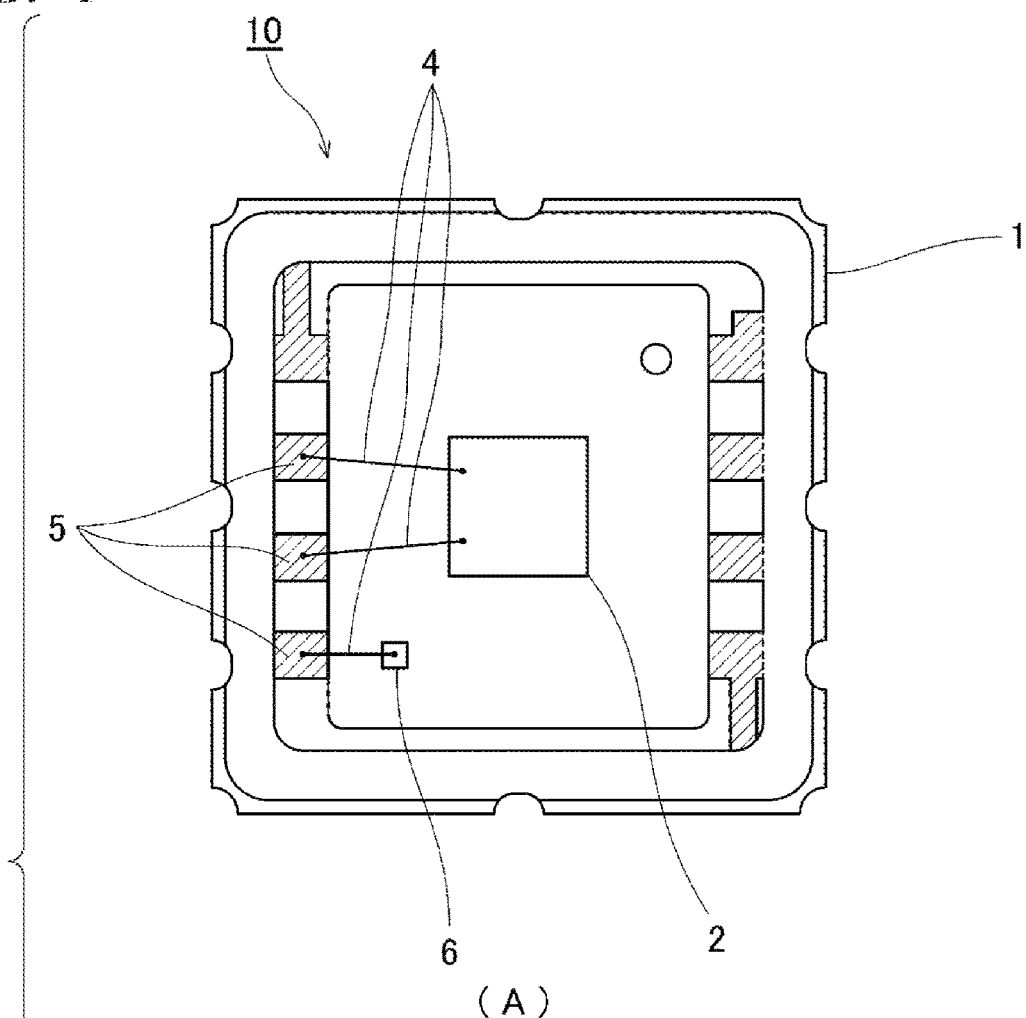
FIG. 1 is a schematic view showing the configuration of a light-emitting device according to one embodiment. (A) is a plan view and (B) is a side view.
Figure 1:
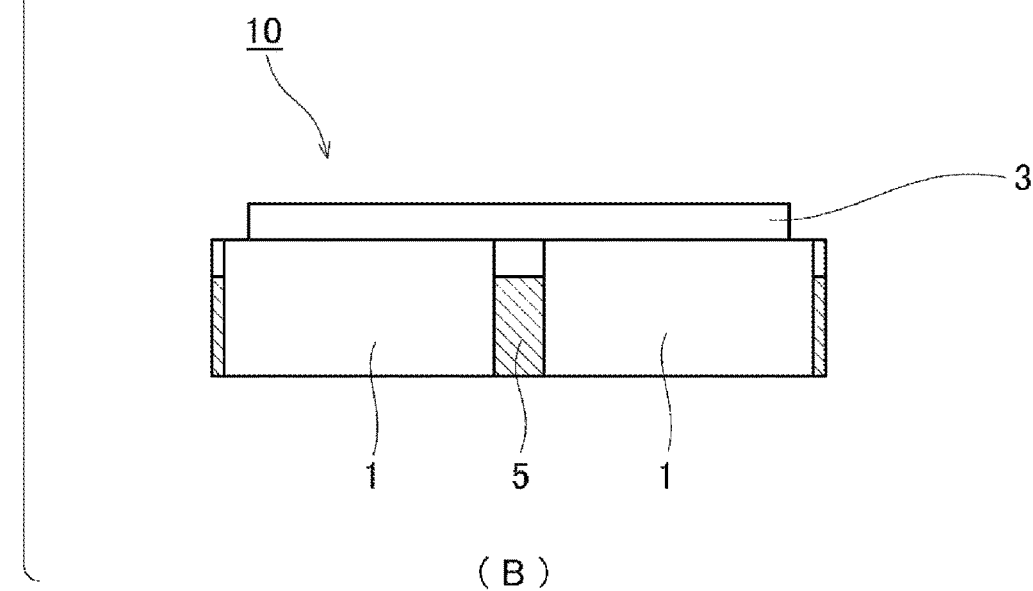
Figure 2:
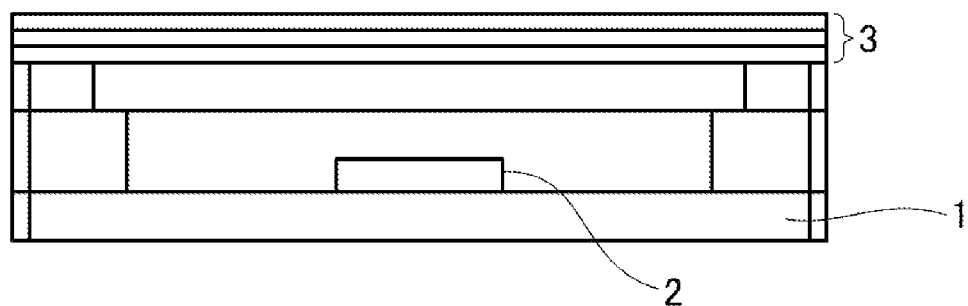
FIG. 2 is an explanatory diagram showing a lamination example of a solid-state light source and a fluorescent film.

FIG. 1 shows a schematic plan view and side view showing the configuration of a light-emitting device according to one embodiment. FIG. 2 shows a lamination example of a solid-state light source and a fluorescent film. A light-emitting device 10 shown in FIGS. 1 and 2 comprises a solid-state light source 2 mounted on a package 1, and a fluorescent film 3 covering the solid-state light source 2. The package 1 is configured with a cup-shaped substrate having a recess, the solid-state light source 2 being provided to a bottom surface of the recess, and an opening section of the recess being covered by the fluorescent film 3. The fluorescent film 3 is omitted in FIG. 1(A). As the substrate constituting the package 1, it is possible to use a surface mount package (SMD package) or a chip-on-board substrate (COB substrate), etc., using a resin plate, a ceramic plate, or the like. The solid-state light source 2 is joined to the package 1 using a die attach material such as silver paste (not shown), and is electrically connected to the package 1 by a wire 4 comprising gold, etc., such that the positive electrode and the negative electrode of the solid-state light source 2 are connected to respective electrode pads 5 of the positive electrode and the negative electrode of the package 1. In the case of flip-chip mounting, it is possible to connect electrically using a protruding terminal that uses a conductive member instead of the wire 4. The fluorescent film 3 is provided to the upper side of the solid-state light source 2, at a predetermined space from the upper surface of the solid-state light source 2, so as to cover the opening section of the recess of the package 1 and be parallel to the upper surface of the solid-state light source 2. Due thereto, the fluorescent film 3 is provided so as to cover the entire solid-state light source 2 and so that the main surface of the fluorescent film 3 perpendicularly intersects light from the solid-state light source 2.

In FIG. 2, the fluorescent film 3 is configured with three layers but may be configured as a single layer and may be configured with any number of layers of two or more layers. Details of the layer configuration will be described later. When the fluorescent film 3 is formed with a plurality of layers (two or more layers), each layer is laminated in the traveling direction of light from the solid-state light source 2. In FIG. 1, the fluorescent film 3 is provided at a predetermined space from the upper surface of the solid-state light source, but the space may be filled by a transparent member, etc., such as an inert gas, a resin, or glass. Further, the fluorescent film 3 may be provided so as to contact the solid-state light source 2

If necessary, an electrostatic protection element 6 such as a zener diode or an ESD element may be connected to the electrode pad 5 by the wire 4, in parallel with the solid-state light source 2, as shown in FIG. 1.

Solid-State Light Source

The solid-state light source is a solid-state light source that emits light having a peak wavelength in the range of 480 nm or less. The solid-state light source may also be a solid-state light source that emits light having a peak wavelength in the range of 450 nm or less, or 410 nm or less. The lower limit value of the range of the peak wavelength of light emitted by the solid-state light source is not particularly limited, and may be 260 nm or more, 330 nm or more, or 350 nm or more. Herein, unless otherwise specified, the term "peak wavelength" is a wavelength at which the spectral emission spectrum shows a peak, and, thereamong, a wavelength at which a maximum intensity is shown is referred to as a "maximum peak wavelength". By using a solid-state light source that emits light having a peak wavelength in the above range, it is possible to excite various phosphors described later. Further, the emission spectrum of the solid-state light source normally has a full width at half maximum of 10 nm or more, and the emission spectrum may be considered to take an intensity distribution according to a Gaussian function, and thus, a cut-off wavelength (for example, a wavelength at which the fluorescence intensity is less than 1.5% of the intensity at the maximum peak wavelength) has a width (distance between the short-wavelength side cutoff wavelength and the long-wavelength side cutoff wavelength) of 20 nm or more. Therefore, by using, for example, a solid-state light source that emits light having a peak wavelength in the range of 400 nm or less, it is possible to configure a light-emitting device having an ultraviolet region emission spectrum of 380 nm or less.

As the solid-state light source, it is possible to use, for example, at least one selected from a light-emitting diode (LED), a laser diode (LD), and an organic electroluminescent light-emitting element (organic EL element). Examples of the LED or LD include InGaN-based, GaN-based, and AlGaN-based ultraviolet-to-purple-emitting LEDs or LDs. Examples of the organic EL element include organic EL elements in which a light-emitting layer comprises one or more blue-based light-emitting materials selected from compounds having, in the framework, an aromatic group such as naphthalene, distyrylarylene, oxazole, isoxazole, oxadiazole, imidazole, carbazole, pyrazole, pyrrole, furan, furazan, benzofuran, isobenzofuran, fluorene, pyridine, pyran, benzopyran, pyrazine, pyrimidine, pyridazine, bipyridine, quinoxaline, xanthene, phenazine, phenoxazine, dibenzodioxin, dibenzofuran, and derivatives thereof.

Fluorescent Film

The fluorescent film is provided so as to cover the solid-state light source and includes at least one kind of phosphor. The fluorescent film may be configured with a single layer and may be configured with two or more layers. The fluorescent film includes at least one kind of near-infrared phosphor (hereinafter, also referred to simply as "near-infrared phosphor") that is excited by light from the solid-state light source and emits light having a peak wavelength (preferably, a maximum peak wavelength) in the range exceeding 700 nm, preferably in the range of 750 nm or more, and having an emission spectrum with a full width at half maximum (FWHM) of 100 nm or more, preferably 120 nm or more, more preferably 150 nm or more, and particularly preferably 200 nm or more.

As described above, the term "near-infrared phosphor" herein means "a phosphor that is excited by light from a solid-state light source and emits light having a peak wavelength (preferably, a maximum peak wavelength) in the range exceeding 700 nm and having an emission spectrum with a full width at half maximum of 100 nm or more in a range including the peak wavelength". Generally, the term "near-infrared" is used as a term that indicates a wavelength range of approximately 780 nm to 3,000 nm. The near-infrared phosphor used in the present embodiment has a peak wavelength in the range exceeding 700 nm, the emission spectrum having a full width at half maximum of 100 nm or more in a range including the peak wavelength, and the emission spectrum may be considered to take an intensity distribution according to a Gaussian function. Thus, a cut-off wavelength (for example, a wavelength at which the fluorescence intensity is less than 1.5% of the intensity at the maximum peak wavelength) has a width (distance between the short wavelength side cut-off wavelength and the long wavelength side cut-off wavelength) of 200 nm or more. Therefore, it is possible for a spectrum in a wavelength range exceeding at least 780 nm to be exhibited and there is no contradiction with the general meaning.

The fluorescent film includes a near-infrared phosphor that is excited by light from the solid-state light source, has a peak wavelength in the range exceeding 700 nm, and forms a broad peak with a full width at half maximum of 50 nm or more, and in particular, 100 nm or more, in the emission spectrum, and therefore it is possible to configure a light-emitting device that, by being excited by light from the light source mentioned above, has a constant intensity in the near-infrared region and a broad peak wavelength. In addition, by combining with the above solid-state light source or a visible phosphor, which is described below and may be included as required, it is possible to configure a light-emitting device having an emission spectrum of a wide bandwidth from the ultraviolet region to the near-infrared region. The near-infrared phosphor may have a peak wavelength in the range exceeding 700 nm and preferably in the range of 750 nm or more, and may also have a peak wavelength in another range. For example, the near-infrared phosphor may also be configured to have a peak wavelength in the range of 600 nm or more to 700 nm or less, and in the range exceeding 700 nm.

Figure 5:
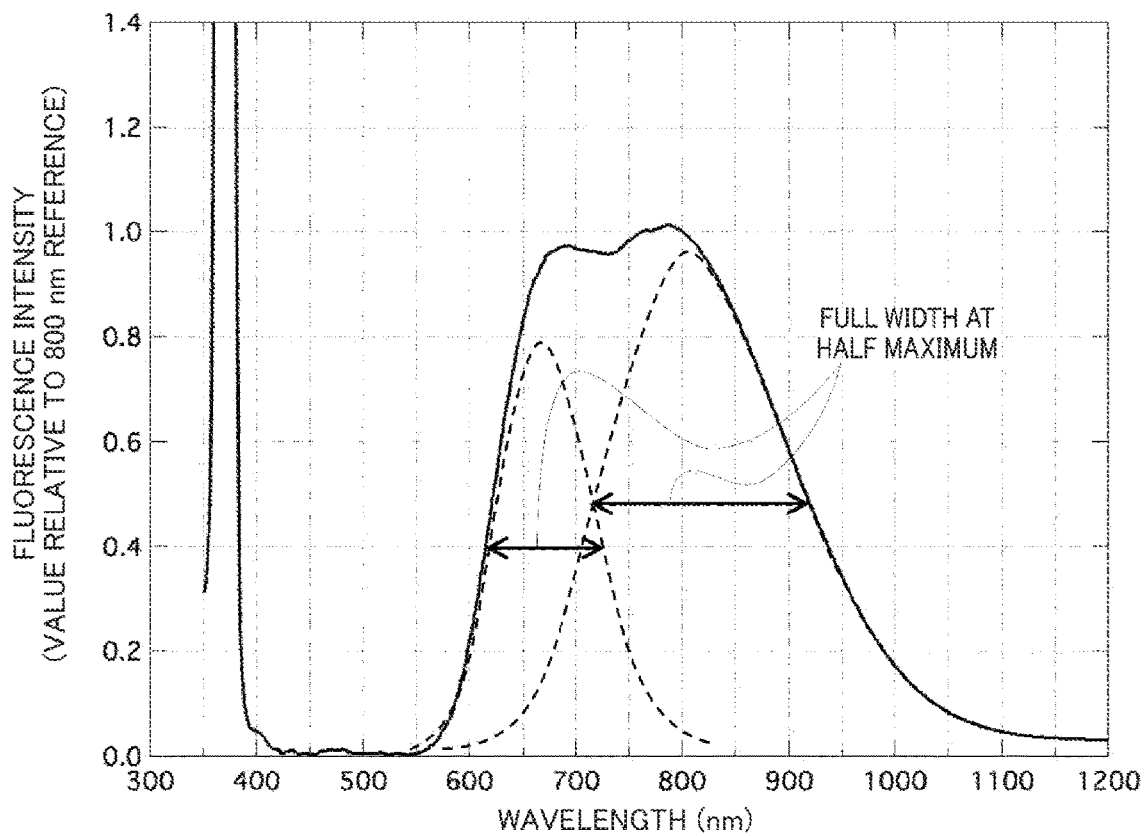
FIG. 5 shows the emission spectrum of the near-infrared phosphor P8 used in the examples.

One example of an emission spectrum of a near-infrared phosphor will be described on the basis of FIG. 5. FIG. 5 shows an emission spectrum (light source: xenon lamp spectrally dispersed at 370 nm) of the near-infrared phosphor P8 used in an example described later. As shown in FIG. 5, this near-infrared phosphor has peak wavelengths at 680±3 nm and 776±3 nm. That is, this near-infrared phosphor has one peak wavelength in the range exceeding 700 nm. The full widths at half maximum of the emission spectra are 113 nm and 209 nm, respectively. These two peaks overlap one another, and the cut-off wavelength of the emission spectrum containing both peaks (for example, a wavelength at which the fluorescence intensity is less than 1.5% of the intensity at 800 nm) is 540±3 nm on the short wavelength side and 1,200 nm±3 nm on the long wavelength side. The emission spectrum of the near-infrared phosphor may have a peak wavelength in the range exceeding 700 nm and is not limited to the same waveform as the emission spectrum shown in FIG. 5.

A light-emitting device configured with a fluorescent film using this near-infrared phosphor (fluorescent film not comprising a visible phosphor described later) and the solid-state light source mentioned above has a peak wavelength at approximately the same as that of FIG. 5, although the intensity balance is arbitrary.

As long as the phosphor has a peak wavelength in the above range, the near-infrared phosphor is not particularly limited. Examples of the near-infrared phosphor include europium- or cerium-activated nitride or oxynitride phosphors. These emit light due to transitions between 5d and 4f and are preferable because the with at half maximum width is wide. In particular, a phosphor to which a divalent europium (divalent europium ion) is added is more preferable because the width at half maximum thereof is wide and the emission intensity thereof is high.

Examples of the europium- or cerium-activated nitride or oxynitride phosphor include nitride phosphors that contain europium as an activator in a host crystal, the host crystal being a nitride of one or more metals selected from the group consisting of Li, Sr, La, and Si.

Configuring the near-infrared phosphor so as to have a composition shown by formula (I) below is preferable since the width at half maximum thereof is wide. In formula (I) below, configuring the near-infrared phosphor so as to have a composition wherein 0.88≤f≤1.01 is more preferable since the emission intensity would be high.

$$Li_aSr_bLa_cSi_dN_eEu_f \qquad (I)$$

wherein a-f are values satisfying: a+b+c+d+e+f=100; and 0≤a≤8.22, 0.22≤b≤17.33, 1.12≤c≤11.36, 22.41≤d≤38.09, 49.47≤e≤56.09, and 0.05≤f≤10.

The content of the near-infrared phosphor in the total phosphor included in the fluorescent film is preferably 5 mass % or more and 50 mass % or less, more preferably 10 mass % or more and 30 mass % or less, and still more preferably 15 mass % or more and 25 mass % or less. By setting within the above range, it is possible to obtain the light emission of the near-infrared phosphor without inhibiting the light emission of another phosphor layer.

Besides the near-infrared phosphor mentioned above, the fluorescent film may also include at least one kind of visible phosphor (hereinafter, also referred to simply as "visible phosphor") that is excited by light from the solid-state light source and emits light having a peak wavelength (preferably, a maximum peak wavelength) in the range of 350 nm or more to 700 nm or less. By including a visible phosphor, it is possible to configure a light-emitting device having a broad bandwidth emission spectrum including the ultraviolet region, the visible light region, and the near-infrared region.

As described above, the term "visible phosphor" herein means "a phosphor that is excited by light from a solid-state light source and emits light having a peak wavelength (preferably, a maximum peak wavelength) in the range of 350 nm or more to 700 nm or less". Generally, the term "visible" is used as a term that indicates a wavelength range of approximately 380 nm-780 nm. The visible phosphor used in the present embodiment has a peak wavelength in the range of 350 nm or more to 700 nm or less, an emission spectrum with full width at half maximum being normally 50 nm or more, and the emission spectrum may be considered to take an intensity distribution according to a Gaussian function. Thus, the cutoff wavelength (for example, a wavelength at which the fluorescence intensity is less than 1.5% of the intensity at the maximum peak wavelength) has a width (range of the short-wavelength side cutoff wavelength to the long-wavelength side cutoff wavelength) of 100 nm or more, and therefore, the spectrum is exhibited over the entire wavelength range of approximately at least 380 nm to 780 nm, and there is thus no contradiction with the general meaning.

The visible phosphor is not particularly limited as long as it is a phosphor having a peak wavelength in the range mentioned above, and examples thereof include: a phosphor A (hereinafter also referred to simply as "visible phosphor A") that is excited by light from the solid-state light source and emits light having a peak wavelength in the range of 350 nm or more to less than 430 nm; a phosphor B (hereinafter also referred to simply as "visible phosphor B") that is excited by light from the solid-state light source and emits light having a peak wavelength in the range of 430 nm or more to less than 500 nm; and a phosphor C (hereinafter also referred to simply as "visible phosphor C") that is excited by light from a solid-state light source and emits light having a peak wavelength in the range of 500 nm or more to less than 700 nm. Preferably, the phosphors A-C each have a maximum peak wavelength in the abovementioned ranges. From the perspective of more certainly exhibiting a broad bandwidth emission spectrum, the visible phosphor preferably comprises one or more of each of the phosphors A-C. Note that the peak wavelength of the visible phosphor can be adjusted to an arbitrary wavelength within each region by adjusting the content of an activator of the visible phosphor or adjusting the mixing ratio of the mixture.

Examples of the visible phosphor A include: a π-electron-conjugated organic phosphor A1 (hereinafter also referred to as "visible phosphor A1"); and a mixed phosphor A2 (hereinafter also referred to as "visible phosphor A2") comprising a europium-activated oxysulfide phosphor and a silver-activated zinc sulfide phosphor. One or more selected from these may be used.

Examples of the visible phosphor A1 include phosphors represented by formula (A1) below and having a π-electron-conjugated substituent at positions 2 and 5 of a 1,3,4-oxadiazolyl ring.

[Chem. 1]

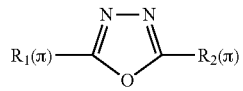
(A1)

$R_1(\pi)$ and $R_2(\pi)$ are hydrogen or π-electron-conjugated substituents, and examples thereof include a phenyl group, a biphenyl group, a naphthyl group, a carbazolyl group, a pyridyl group, and a bipyridyl group. Further, π-conjugated substituents of the foregoing may have a substituent such as an alkyl group with a carbon number from one to ten or a halogen atom, etc. Examples of the alkyl group with a carbon number from one to ten include a methyl group, an ethyl group, a propyl group, an isopropyl group, a dimethylpropyl group, a tert-butyl group, an n-butyl group, an isobutyl group, and a pentyl group, etc.

The visible phosphor A1 may also be configured as, for example, a π-electron-conjugated organic phosphor comprising 1-3 of each of a 1,3,4-oxadiazolyl ring ($-C_2N_2O-$), a 1,4-phenyl ring ($-C_6H_4-$), and a 1-phenyl ring ($-C_6H_5$). The visible phosphor A1 preferably has a purity of 90% or more. One or more selected from the foregoing can be used for the visible phosphor A1.

Examples of the visible phosphor A2 include a mixture of a europium-activated oxysulfide phosphor (A2-1) and a silver-activated zinc sulfide phosphor (A2-2), etc.

Examples of the europium-activated oxysulfide phosphor (A2-1) include oxysulfide phosphors comprising: one or more rare earth metals selected from the group consisting of gadolinium, yttrium, and lanthanum; an oxysulfide as a host crystal; and europium as an activator in the host crystal.

The europium-activated oxysulfide phosphor may also be a phosphor represented by formula (A2-1) below.

$$(A_{2-x}Eu_x)_2O_2S \qquad (A2\text{-}1)$$

wherein A is any one of Ga, Y, and La, and x is a number satisfying 0<x<0.1.

The silver-activated zinc sulfide phosphor (A2-2) may be a phosphor represented by formula (A2-2) below.

$$(Zn_{1-x}Ag_{2x})S \qquad (A2\text{-}2)$$

wherein x is a number satisfying 0<x<0.1.

In the visible phosphor A2, the mixing ratio of the europium-activated oxysulfide phosphor (A2-1) and the silver-activated zinc sulfide phosphor (A2-2) can be set, as a mass ratio [(A2-1)/(A2-2)], to 0.1 or more and 9 or less.

Examples of the visible phosphor B include europium-activated alkaline earth aluminate phosphors. Examples of a europium-activated alkaline earth aluminate phosphor include phosphors including: as a host crystal, an aluminate of one or more Group 2 elements selected from the group consisting of calcium, strontium, magnesium, and barium; and europium as an activator in the host crystal. One or more selected from the foregoing can be used as the visible phosphor B.

The visible phosphor B may also be a phosphor represented by formulae (B1) to (B4) below.

$$(A_{1-x}Eu_x)Al_{11}O_{17} \qquad (B1)$$

wherein A is Ca, Sr, Mg, Ba or a combination thereof, and x is a number satisfying 0<x<0.1.

$$(Sr_{0-0.8}Si_6N_8):Eu_{0.01-0.2} \quad (B2)$$

$$(Ca_{0.25-2}Si_{0.01-11.49}Al_{0.51-11.99}O_{0.01-11.49}N_{4.51-15.99}): \\ Ce_{0.001-0.5} \quad (B3)$$

$$Al_{4.6}Si_{0.3-0.39}N_5Eu_{0.01-0.1} \quad (B4)$$

Examples of the visible phosphor C include europium-activated strontium silicate phosphors. Examples of a europium-activated strontium silicate phosphor include phosphors including strontium silicate as a host crystal and europium as an activator in the host crystal, and examples thereof include visible phosphors C1 to C5 represented by formulas (C1) to (C5) below.

$$(Sr_{1-x},Eu_x)_3SiO_5 \quad (C1)$$

wherein x is a number satisfying 0<x<0.1.

$$(Sr_{1-x-y},Ba_x,Eu_y)_3SiO_5 \quad (C2)$$

wherein x and y are numbers satisfying 0<x<1, 0<y<0.1.

$$(Sr_{1-x-y},Ba_x,Eu_y)_2SiO_4 \quad (C3)$$

wherein x and y are numbers satisfying 0<x<1, 0<y<0.1.

$$Me_2Si_5N_8:Eu \quad (C4)$$

$$MeAlSiN_3:Eu \quad (C5)$$

wherein, in formulae (C4) and (C5), Me represents Ca, Sr, or Ba.

One or more selected from the visible phosphors C1 to C5 above may be used as the visible phosphor C.

The total content of the phosphor in each layer is preferably 3 mass % or more and 75 mass % or less, and more preferably 5 mass % or more and 60 mass % or less. By setting within the above range, it is possible to form a homogeneous layer having good dispersion properties and to effectively obtain light emission from the phosphor, as well as achieving a condition in which light dissipation due to scattering in the layer is suppressed and providing sufficient emission intensity and narrow radiation angle characteristics.

The content of the visible phosphor may be selected according to the desired light amount balance for each wavelength. For example, the content of the phosphor A in the total phosphor included in the fluorescent film is preferably 2 mass % or more and 50 mass % or less, and more preferably 5 mass % or more and 35 mass % or less. The content of the phosphor B in the total phosphor included in the fluorescent film is preferably 2 mass % or more and 50 mass % or less, and more preferably 5 mass % or more and 35 mass % or less. The content of the phosphor C in the total phosphor included in the fluorescent film is preferably 1 mass % or more and 30 mass % or less, and more preferably 5 mass % or more and 15 mass % or less.

In the case of a light-emitting device having a continuous emission spectrum at least in the range of 400 nm or more to 1,000 nm or less, combining the visible phosphors with the abovementioned near-infrared phosphors, the number of kinds of phosphors included in the fluorescent film can be set at two or more in total, preferably three or more, and more preferably five or more. The upper limit is not particularly limited, and may be set at ten or less or eight or less.

When the fluorescent film is configured with a plurality of layers, the kind of phosphor included in each layer is preferably one or more and four or less, and more preferably one or more and three or less. By setting the kind of the phosphors to one or more and four or less, it is possible to prevent the dispersibility of the phosphor from deteriorating due to including many kinds of phosphors having different specific gravities and particle diameters.

The fluorescent film is configured with one or more layers, and is preferably configured with a plurality of layers each having a different kind of phosphor included therein. By configuring with a plurality of layers each having a different kind of phosphor included therein, the number of kinds of phosphor included in one layer is not excessively large and therefore the dispersibility of the phosphor is increased and a uniform fluorescent film can be obtained. The number of layers constituting the fluorescent film may be set at one or more, two or more, or three or more, and may be set at eight or less, seven or less, or five or less.

The "kind of phosphor" means a kind that is distinguished by the peak wavelength of the phosphor. Even when the components of the host crystal and the mixture are the same, phosphors having different peak wavelengths differ in kind due to differences in the amount of activating material added and in the mixing ratio of the components of the mixture, etc. "A plurality of layers (two or more layers) each having a different kind of phosphor" means that at least one kind of phosphor included in one layer is not the same as a kind of phosphor included in another layer. From the perspective of efficiently fabricating a fluorescent film capable of exhibiting a broad bandwidth emission spectrum, it is preferable that all kinds of included phosphors differ between layers. In order to configure "a plurality of layers each having a different kind of phosphor", it is possible to configure with two layers, for example: a layer including a near-infrared phosphor; and a layer including the visible phosphors A-C. Alternatively, it is also possible to configure a plurality of layers each having a different kind of phosphor by configuring with four layers: a layer including a near-infrared phosphor; a layer including the visible phosphor A; a layer including the visible phosphor B; and a layer including the visible phosphor C. It is also possible for each kind of phosphor to be laminated as a separate layer.

However, light of a phosphor having a peak wavelength in the ultraviolet region and the visible region near the ultraviolet region, in particular, tends to be lost due to reabsorption by another phosphor. As such, when the fluorescent film includes the visible phosphor A and the visible phosphor B, it is preferable to include the visible phosphor A and the visible phosphor B in different layers with an objective of obtaining emission of light having sufficient intensity on the short wavelength side while preventing deactivation of light. Meanwhile, the near-infrared phosphor and the visible phosphor C do not exert any significant effects on the intensity of the emission spectrum even when mixed with another phosphor.

When the fluorescent film is formed with a plurality of layers each having a different kind of phosphor, the plurality of layers are preferably laminated, in the traveling direction of light from the solid-state light source, in an order from a layer including a phosphor having a longer peak wavelength to a layer including a phosphor having a shorter peak wavelength. By setting such a configuration, it is possible for fluorescent light emitted to be utilized in the excitation of a phosphor included in a subsequent layer and to prevent light having a short wavelength from being lost.

The thickness of each layer of the fluorescent film can be adjusted according to the ratio of the phosphors contained therein. For example, when the content of the phosphor is 5 mass % or more and 60 mass % or less, the thickness can be set to 1 μm or more and 500 μm or less, and when the content of the phosphor is more than 60 mass %, the thickness can be set to 10 μm or more and 100 μm or less.

The method for fabricating the fluorescent film is not particularly limited and the film may be fabricated, for example, by using a publicly-known stirring/kneading device to disperse an abovementioned phosphor in a thin film material such as a silicone resin, an epoxy resin, an ethyl cellulose, or glass, if necessary, together with a dispersant such as a silicone nano powder, to form a paste, and then coating or printing on a solid-state light source or on a transparent substrate such as a glass plate by potting, spraying, spin coating, screen printing, gravure printing, or the like. The mixing method in the case where a plurality of phosphors is mixed and used is not particularly limited, and may be performed using a conventional mixing device. When the fluorescent film is configured with a plurality of layers, the layers may be bonded with a silicone resin or an epoxy resin, etc., or may be fixed so as to be pressed by a fixing component. With respect to the bonding method when the fluorescent film is mounted on a package, too, the fluorescent film may be bonded in the same manner with a silicone resin or an epoxy resin, etc., or may be fixed so as to be pressed by a fixing component.

Light-Emitting Device

It is preferable that the light-emitting device according to the present embodiment has a continuous emission spectrum (hereinafter also referred to as "continuous spectrum") at least in the range of 400 nm or more to 1,000 nm or less. By having a continuous spectrum in this range, the light-emitting device can be preferably used as a light source for industrial equipment for which emission over a broad bandwidth range is demanded. "Continuous emission spectrum" means that the emission intensity (hereinafter also referred to as "fluorescence intensity") of the emission spectrum is 0.01 or more (1% or more), as a value relative to an 800 nm reference, across the entire region within this range. Since the value relative to the 800 nm reference is 1% or more in the entire region of the abovementioned range, the light-emitting device can be more preferably used as a light source for industrial equipment. When used as a standard light source, the emission intensity (fluorescence intensity) of the emission spectrum is preferably 0.015 or more (1.5% or more) as a value relative to the 800 nm reference, and, from the perspective of ease of use, more preferably 0.05 or more (5% or more), across the entire region within this range.

Figure 6:
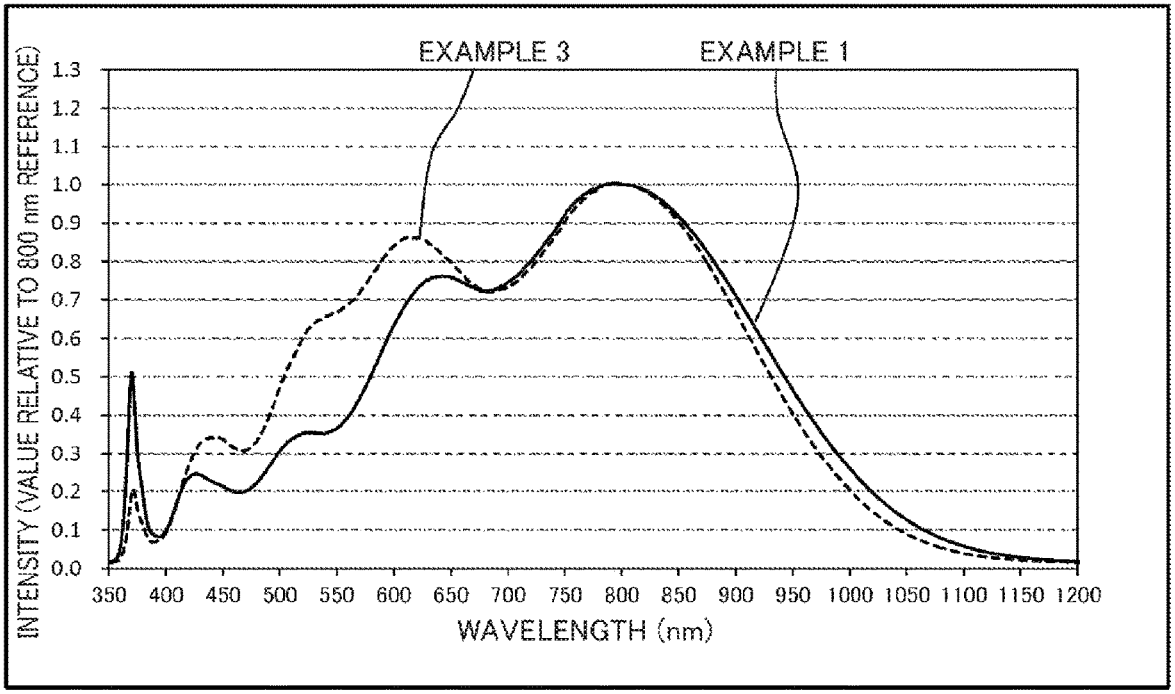
FIG. 6 shows emission spectra of the light-emitting device of Examples 1 and 3.

For example, in the spectrum of Example 1 shown in FIG. 6, the fluorescence intensity at the two ends (350 nm and 1,200 nm) of the continuous spectrum is, respectively, 1.7% and 1.9% with respect to a maximum intensity near 800 nm, and the fluorescence intensity at a minimum point near 390 nm is also 8.2%. Thus, all intensities exceed 1.5% and it can be said that the light-emitting device has a continuous emission spectrum in the range of 350 nm or more to 1,200 nm or less. As such, this light-emitting device has a continuous emission spectrum at least in the range of 400 nm or more to 1,000 nm or less, and can be sufficiently used as a standard light source for industrial equipment.

The light-emitting device can be configured so as to have a broader bandwidth continuous spectrum, depending on the emission spectra of the solid-state light source and the near-infrared phosphor used. For example, in the case in which a solid-state light source that emits light having a peak wavelength in a range of 410 nm or less is used as the solid-state light source, when the full width at half maximum of the emission spectrum is 50 nm or more, it is possible to configure a light-emitting device having a continuous spectrum at least in the range of 360 nm or more.

Further, by using the near-infrared phosphor according to the present embodiment, it is possible to realize a continuous spectrum of a broad bandwidth including the region exceeding 1,200 nm. An embodiment to be described later shows an example of a light-emitting device having a continuous emission spectrum at least in the range of 350 nm or more to 1,200 nm or less.

The light-emitting device has a peak wavelength in the near-infrared region exceeding 700 nm. When a strong light intensity is required in the near-infrared region, the continuous emission spectrum exhibited by the light-emitting device has a wavelength at which a maximum emission intensity is obtained in the near-infrared region exceeding 700 nm. When light emission on the higher wavelength end is demanded, by adjusting the composition or mixing ratio of the near-infrared phosphor, it is possible to configure so as to have a peak wavelength in the range of 750 nm or more or 800 nm or more. By having a peak wavelength in the near-infrared region, it is possible to obtain light having a broader wavelength range than that of conventional LEDs, and therefore the light-emitting device can be more suitably used as a light-emitting device for industrial equipment such as a spectroscopic analyzer, etc.

Examples of industrial equipment include spectroscopic analyzers such as white light interferometry film thickness gauges, handy-type colorimeters, and industrial equipment in which halogen lamps are used.

Since it is desirable that white light interferometry film thickness gauges include a plurality of fringes (interference fringes) in the range of the wavelength bandwidth of a light source, particularly in order to measure the film thickness of an ultrathin film, etc., using a light source having a broader bandwidth is demanded. Conventional LED light sources cannot achieve a sufficient broad bandwidth, but the light-emitting device according to the present embodiment enables a sufficient wavelength bandwidth as a light source of a white light interferometry film thickness gauge to be achieved.

Handy-type colorimeters have conventionally been set to a photometric range of 400 nm to 700 nm to match the bandwidth of a light source. However, the XYZ color system established by the International Commission on Illumination (CIE) is specified at 380 nm to 780 nm, and therefore exact measurement is difficult with conventional handy-type colorimeters. The light-emitting device according to the present embodiment has at least a broad bandwidth emission spectrum in the range of 400 nm or more to 1,000 nm or less, and therefore enables accurate measurement in accordance with CIE specifications. As a result thereof, the light-emitting device according to the present embodiment can contribute to a wide range of industries such as lighting, color, printing, and paint fields.

Halogen lamps are used as light sources for many kinds of industrial equipment. However, for example, those used in spaces shut-off from the outside, such as clean rooms, or the like, may experience problems of heat generation and waste heat. The emission spectrum of the light-emitting device according to the present embodiment can be adjusted to an emission spectrum similar to that of a halogen lamp, and therefore the light-emitting device of the present embodiment can be suitably used as an alternative to a halogen lamp. When used as an alternative for a halogen lamp, by combining a plurality of phosphors described above, it is possible to configure a light-emitting device having an emission spectrum similar to the emission spectrum of a halogen lamp.

Modifications

Next, modifications of the light-emitting device according to the present embodiment shall be described. In the following modifications, only differences from the first embodiment and another modification are described. Any configuration not described below can be deemed to be the same as a previously described configuration.

First Modification

The first modification is a modification in which the fluorescent film of the first embodiment is configured with a plurality of layers (see FIG. 2), and is configured so that the same surface has a plurality of regions each having a different type of phosphor included therein.

Figure 9:
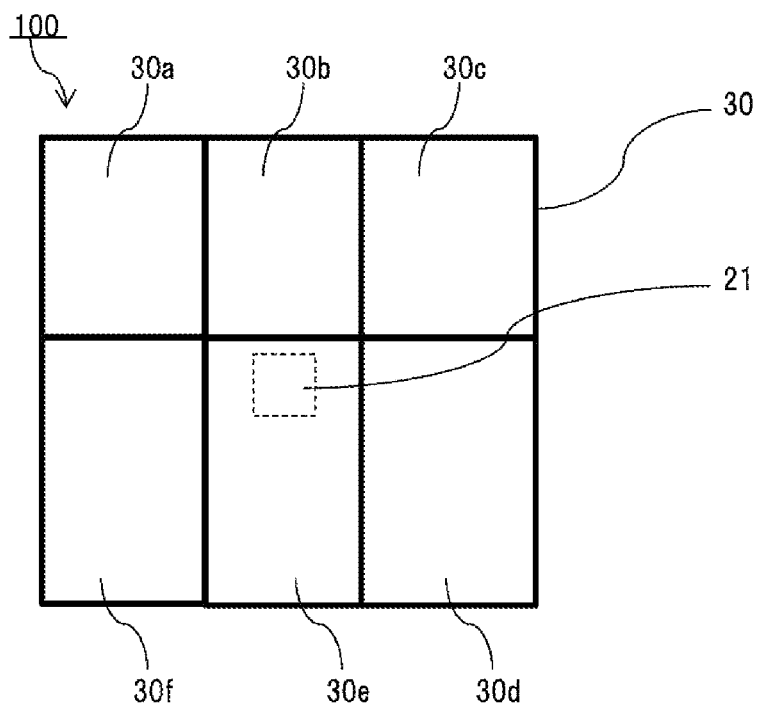
FIG. 9 is a schematic plan view showing a configuration example of a light-emitting device of a first modification.
Figure 10:
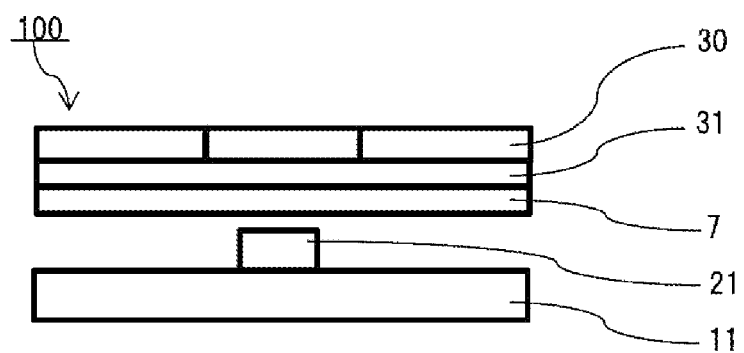
FIG. 10 is a schematic side view showing a configuration example of the light-emitting device of the first modification.

The first modification is described with reference to FIGS. 9 and 10. FIG. 9 is a schematic plan view showing a configuration example of a light-emitting device of the first modification, and FIG. 10 is a schematic side view thereof. A light-emitting device 100 shown in FIGS. 9 and 10 comprises a solid-state light source 21 provided on a package 11, and fluorescent films 30 and 31 provided so as to cover the solid-state light source 21. The fluorescent film 30 has two or more regions (regions 30a to 30f) each having a different kind of phosphor contained therein. As described above, "kind of phosphor" means a kind distinguished by the peak wavelength of the phosphor. Note that in this modification, the fluorescent films 30, 31 are provided on a substrate 7, but the substrate 7 is not an essential configuration. A transparent member such as glass may be used as the substrate. By using such a substrate 7, it is easy to manufacture and easy to handle the film and it is also possible to maintain strength.

Further, in this modification, an example in which the fluorescent film 30 is laminated with another fluorescent film 31 is shown, but it is possible to use the fluorescent film 30 alone as a single layer. When used as a single layer, the fluorescent film 30 is configured so as to include a near-infrared phosphor in at least one region. In that case, it is preferable that the fluorescent film 30 has a region including at least one kind of near-infrared phosphor (for example, the region 30a) and a region including at least one kind of visible phosphor (for example, the regions 30b to 30f). When the fluorescent film 30 does not include a near-infrared phosphor, the fluorescent film 30 may be laminated with the fluorescent film 31 that includes at least one kind of near-infrared phosphor and used. The configuration of the other fluorescent film 31 is not particularly limited, and may be a fluorescent film in which the same surface has two or more regions each having a different type of phosphor included therein (same configuration as that of the fluorescent film 30), and may be a fluorescent film configured with one region comprising one or more phosphors.

When the fluorescent film 30 is laminated with the other fluorescent film 31, in the same manner as the first embodiment having a configuration comprising a plurality of layers, it is preferable to laminate, in the traveling direction of light from the solid-state light source, in an order from the fluorescent film including a phosphor having a longer peak wavelength to the fluorescent film including a phosphor having a shorter peak wavelength. By setting such a configuration, it is possible for fluorescent light emitted to be utilized in the excitation of a phosphor included in a subsequent layer and to prevent light having a short wavelength from being lost.

In FIG. 9, the fluorescent film 30 is configured with six regions 30a-30f, but the number of regions is not limited thereto and it is possible to configure with any number of two or more regions. Among the foregoing, from the perspective of preventing loss of fluorescent light emitted, it is preferable that the fluorescent film is configured with four or more regions each having a different phosphor included therein.

The method for fabricating the fluorescent film 30 is not particularly limited, and the fluorescent film 30 may be fabricated by printing with an ink including a phosphor or by arranging, on the same surface, separate fluorescent films fabricated in advance by mixing a phosphor and a resin.

Second Modification

Figure 11:
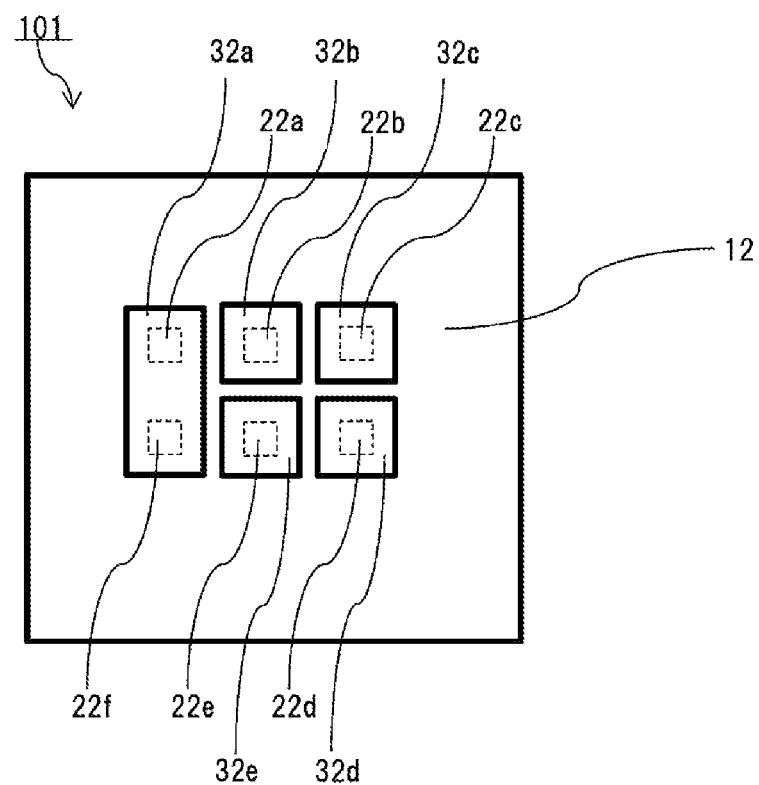
FIG. 11 is a schematic plan view showing a configuration example of a light-emitting device of a second modification.
Figure 12:
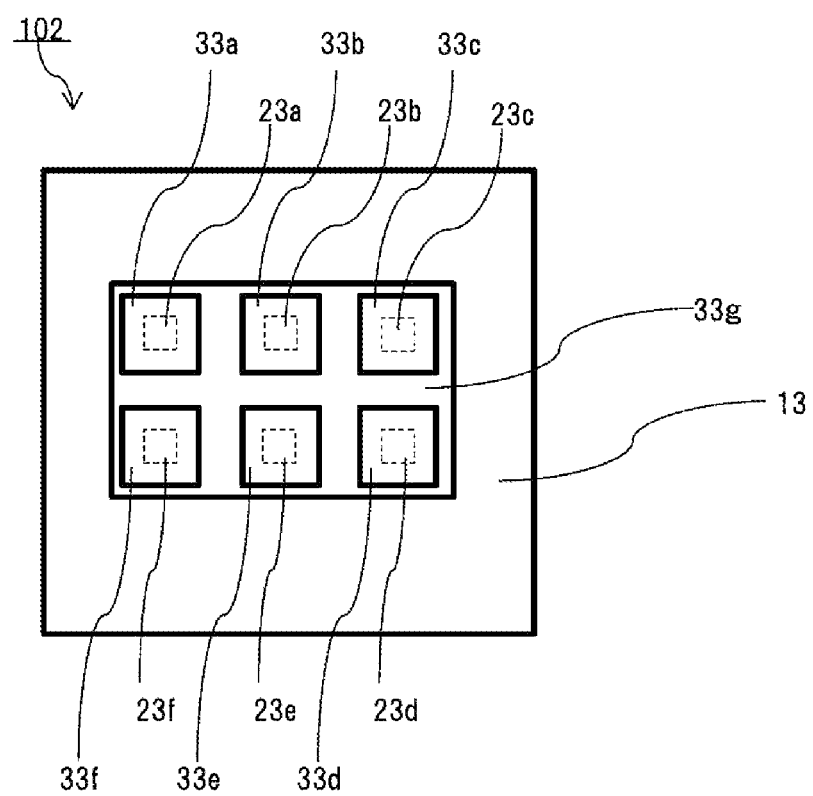
FIG. 12 is a schematic plan view showing a configuration example of the light-emitting device of the second modification.

The second modification is an example wherein two or more solid-state light sources are used. The second modification is described with reference to FIGS. 11 and 12. FIGS. 11 and 12 are schematic plan views showing configuration examples of the light-emitting device of the second modification. A light-emitting device 101 shown in FIG. 11 comprises two or more solid-state light sources 22a-22f provided on the same surface of a package 12, and fluorescent films 32a-32e covering any one or more of the solid-state light sources 22a-22f. A light-emitting device 102 shown in FIG. 12 comprises solid-state light sources 23a-23f, a fluorescent film 33g covering all of the solid-state light sources 23a-23f, and fluorescent films 33a-33f provided on the fluorescent film 33g and provided at positions covering one of the solid-state light sources 23a-23f.

The solid-state light sources 22a-22f and 23a-23f may be solid-state light sources that emit light having the same peak wavelength, and may also be solid-state light sources that emit light having different peak wavelengths. In FIGS. 11 and 12, the solid-state light source is configured with six solid-state light sources 22a-22f or 23a-23f, but the number of solid-state light sources is not limited thereto, and it is possible to configure any number of solid-state light sources, such as two or more, three or more, five or more, ten or more, etc., so as to be able to meet the brightness demanded.

The configuration of the fluorescent film covering each solid-state light source is not limited to those shown in FIGS. 11 and 12, and each solid-state light source may be covered with a separate fluorescent film (preferably, fluorescent films each having a different kind of phosphor included therein), and some or all of the solid-state light sources may be covered with a single fluorescent film. In all cases, at least one fluorescent film is configured so as to include at least a near-infrared phosphor. When each solid-state light source is covered with a separate fluorescent film, it is preferable that at least one fluorescent film among fluorescent films other than a fluorescent film including at least a near-infrared phosphor is a fluorescent film including at least one kind of phosphor selected from the abovementioned visible phosphors. When each solid-state light source is covered with a single fluorescent film, it is preferable that the fluorescent film includes a near-infrared phosphor and a visible phosphor. Further, as the fluorescent film, the fluorescent film having two or more regions on the same surface described in the first modification may be used, and a fluorescent film having a plurality of layers may also be used. The configuration in that case is as described above.

The method for fabricating the fluorescent film is not particularly limited and the fluorescent film may be fabricated by the same fabrication method described above.

In the case of a configuration having a plurality of fluorescent films in the same planar state (for example, a configuration wherein each solid-state light source is covered with a separate fluorescent film), in order to prevent resin from flowing out during heating to cure the resin, for example, a so-called dam may be provided wherein a silicone resin or the like is provided so as to surround the periphery of the solid-state light source.

Other Configurations

In order to control the directionality of emitted light, the light-emitting device, may be provided with a lens so as to cover the solid-state light source and the fluorescent film. Examples of the lens include a single-sided convex lens, a double-sided convex lens, a convex meniscus lens, a rod lens, and an optical fiber, etc.

With an objective of mixing light having different wavelengths, the light-emitting device may further have blasting performed on the light incident surface and the exit surface of the lens. There is no particular limitation on the method of blasting, and the blasting may be carried out by using a publicly-known sandblasting method, or the like.

EXAMPLES

The present invention is described below in further detail with examples being provided, but the interpretation of the present invention is not limited by these examples.

Production Examples 1-14 (Production of Near-Infrared Phosphor)

In the examples, infrared phosphor materials represented by $Li_aSr_bLa_cSi_dN_eEu_f$ (a-f being numbers wherein a+b+c+d+e+f=100) were used in a composition.

Near-infrared phosphors P1-P14 which could be used in the examples were produced in the following manner. Table 1 shows the design composition of these phosphors.

TABLE 1

|  | Si | N | Li | Sr | La | Eu |
|---|---|---|---|---|---|---|
| PHOSPHOR P1 | 37.74 | 55.60 | 0.00 | 4.11 | 1.66 | 0.89 |
| PHOSPHOR P2 | 37.32 | 56.09 | 0.00 | 0.77 | 4.94 | 0.88 |
| PHOSPHOR P3 | 34.18 | 54.42 | 0.00 | 7.63 | 2.85 | 0.91 |
| PHOSPHOR P4 | 33.54 | 55.27 | 0.00 | 1.90 | 8.39 | 0.89 |
| PHOSPHOR P5 | 31.07 | 53.39 | 0.00 | 10.72 | 3.88 | 0.93 |
| PHOSPHOR P6 | 30.29 | 54.57 | 0.00 | 2.88 | 11.36 | 0.91 |
| PHOSPHOR P7 | 24.41 | 51.18 | 0.00 | 17.33 | 6.10 | 0.98 |
| PHOSPHOR P8 | 38.09 | 55.19 | 2.24 | 2.46 | 1.12 | 0.90 |
| PHOSPHOR P9 | 37.81 | 55.52 | 2.22 | 0.22 | 3.34 | 0.89 |
| PHOSPHOR P10 | 34.73 | 53.69 | 3.66 | 4.86 | 1.93 | 0.93 |
| PHOSPHOR P11 | 34.29 | 54.28 | 3.61 | 0.99 | 5.72 | 0.91 |
| PHOSPHOR P12 | 31.75 | 52.36 | 5.29 | 6.99 | 2.65 | 0.95 |
| PHOSPHOR P13 | 31.20 | 53.19 | 5.20 | 1.66 | 7.80 | 0.94 |
| PHOSPHOR P14 | 25.27 | 49.47 | 8.42 | 11.62 | 4.21 | 1.01 |

In order to obtain a phosphor of the design composition mentioned above, raw powders $Si_3N_4$, $Li_3N$, $Sr_3N_2$, LaN, and EuN were weighed at the weight ratios shown in Table 2 and mixed for ten minutes using an agate mortar and pestle. Thereafter, the resulting mixture was filled into a boron nitride crucible. Note that steps of weighing and mixing of the powders were all carried out in a glove box capable of maintaining a nitrogen atmosphere having 1 ppm of moisture or less and 1 ppm of oxygen or less.

TABLE 2

|  | (wt %) | | | | |
|---|---|---|---|---|---|
|  | $Si_3N_4$ | $Li_3N$ | $Sr_3N_2$ | LaN | EuN |
| PHOSPHOR P1 | 68.80 | 0.00 | 15.53 | 9.93 | 5.75 |
| PHOSPHOR P2 | 64.14 | 0.00 | 2.74 | 27.76 | 5.36 |
| PHOSPHOR P3 | 54.64 | 0.00 | 25.30 | 14.89 | 5.17 |
| PHOSPHOR P4 | 49.27 | 0.00 | 5.79 | 40.28 | 4.66 |
| PHOSPHOR P5 | 44.82 | 0.00 | 32.08 | 18.33 | 4.77 |
| PHOSPHOR P6 | 39.52 | 0.00 | 7.79 | 48.48 | 4.21 |
| PHOSPHOR P7 | 29.14 | 0.00 | 42.90 | 23.82 | 4.14 |
| PHOSPHOR P8 | 75.27 | 1.10 | 10.10 | 7.24 | 6.29 |
| PHOSPHOR P9 | 71.49 | 1.04 | 0.87 | 20.63 | 5.97 |
| PHOSPHOR P10 | 62.73 | 1.73 | 18.21 | 11.40 | 5.94 |
| PHOSPHOR P11 | 57.90 | 1.60 | 3.47 | 31.56 | 5.48 |
| PHOSPHOR P12 | 53.28 | 2.21 | 24.32 | 14.53 | 5.67 |
| PHOSPHOR P13 | 48.16 | 1.99 | 5.33 | 39.39 | 5.13 |
| PHOSPHOR P14 | 36.71 | 3.04 | 35.02 | 20.01 | 5.21 |

Thereafter, the boron nitride crucible containing the mixed powder was set in an electric furnace that heats using a graphite resistance method. A calcining operation was performed by first using a diffusion pump to make the calcining atmosphere a vacuum, raising the temperature from room temperature to 800° C. at a rate of 1,200° C. per hour, at 800° C., introducing nitrogen having a purity of 99.999 vol % and setting the pressure to 0.92 MPa, raising the temperature at 600° C. per hour to a calcining temperature of 1,700° C., and maintaining at the 1,700° C. calcining temperature for two hours. After calcining, the infrared phosphor powders P1-P14 were obtained by grinding by hand using a mortar.

The emission characteristics when the phosphors were excited by an Xe light source that spectrally dispersed at 370 nm are shown in Table 3. In Table 3, "emission peak wavelength" shows the "maximum peak wavelength", and the unit of emission full width at half maximum is "nm".

TABLE 3

|  | EMISSSON PEAK WAVELENGTH (nm) | EMISSION FULL WIDTH AT HALF MAXIMUM | RELATIVE INTENSITY | EXCITATION PEAK WAVELENGTH (nm) |
|---|---|---|---|---|
| PHOSPHOS P1 | 797 | 290 | 416 | 443 |
| PHOSPHOR P2 | 811 | 193 | 219 | 443 |
| PHOSPHOR PS | 808 | 212 | 482 | 448 |
| PHOSPHOR P4 | 819 | 201 | 305 | 445 |
| PHOSPHOR P5 | 631 | 276 | 636 | 446 |
| PHOSPHOR P6 | 809 | 199 | 323 | 441 |
| PHOSPHOR P7 | 716 | 164 | 465 | 442 |
| PHOSPHOR P8 | 776 | 288 | 486 | 441 |
| PHOSPHOR P9 | 825 | 203 | 239 | 519 |
| PHOSPHOR P10 | 809 | 203 | 444 | 443 |
| PHOSPHOR P11 | 839 | 218 | 190 | 443 |
| PHOSPHOR P12 | 816 | 202 | 494 | 499 |
| PHOSPHOR P13 | 817 | 200 | 234 | 441 |
| PHOSPHOR P14 | 633 | 121 | 147 | 448 |

Figure 3:
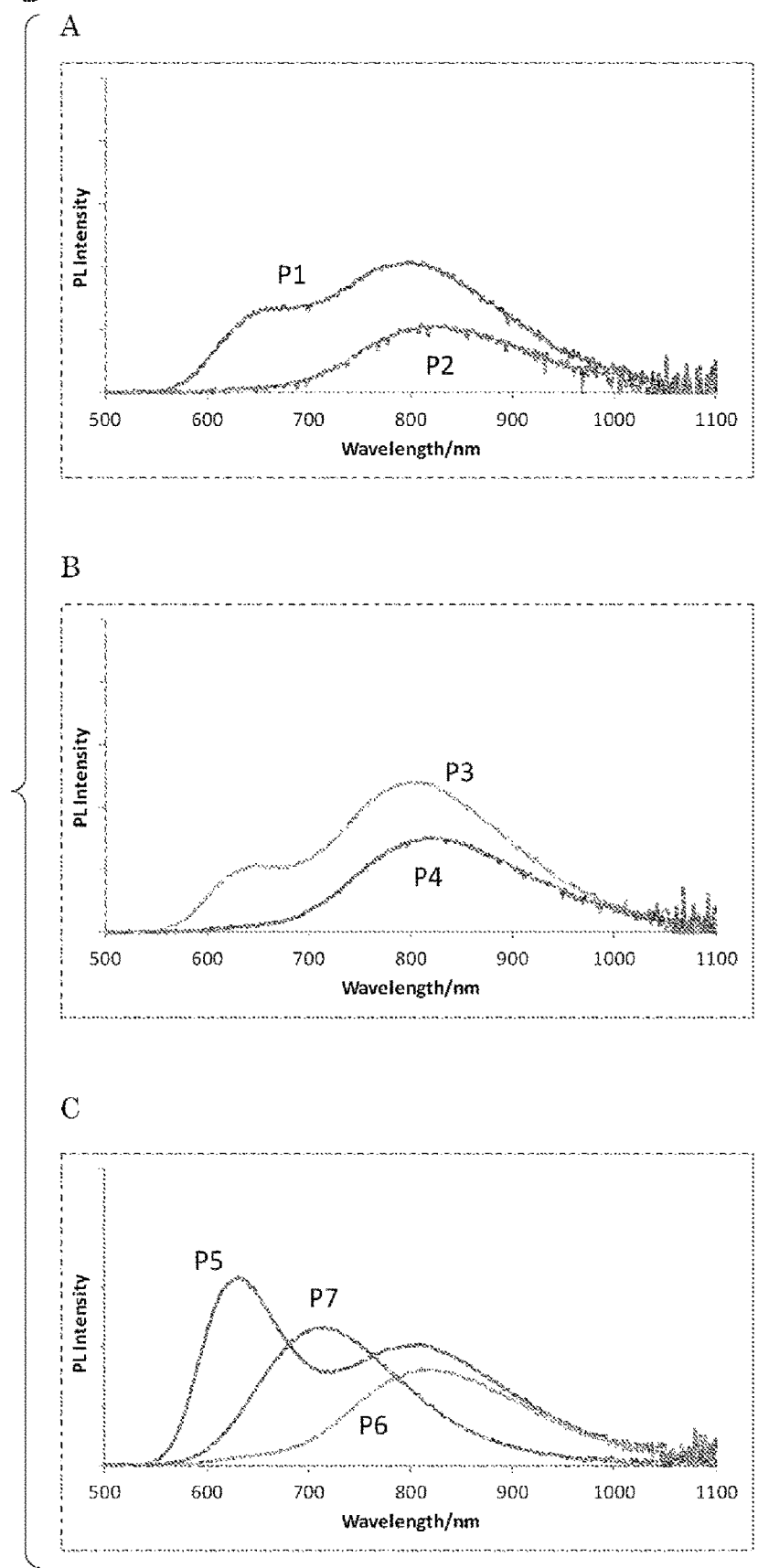
FIG. 3 shows emission spectra of near-infrared phosphors P1-P7 used in the examples. A shows the emission spectra of the near-infrared phosphors P1 and P2. B shows the emission spectra of the near-infrared phosphors P3 and P4. C shows the emission spectra of the near-infrared phosphors P5-P7.
Figure 4:
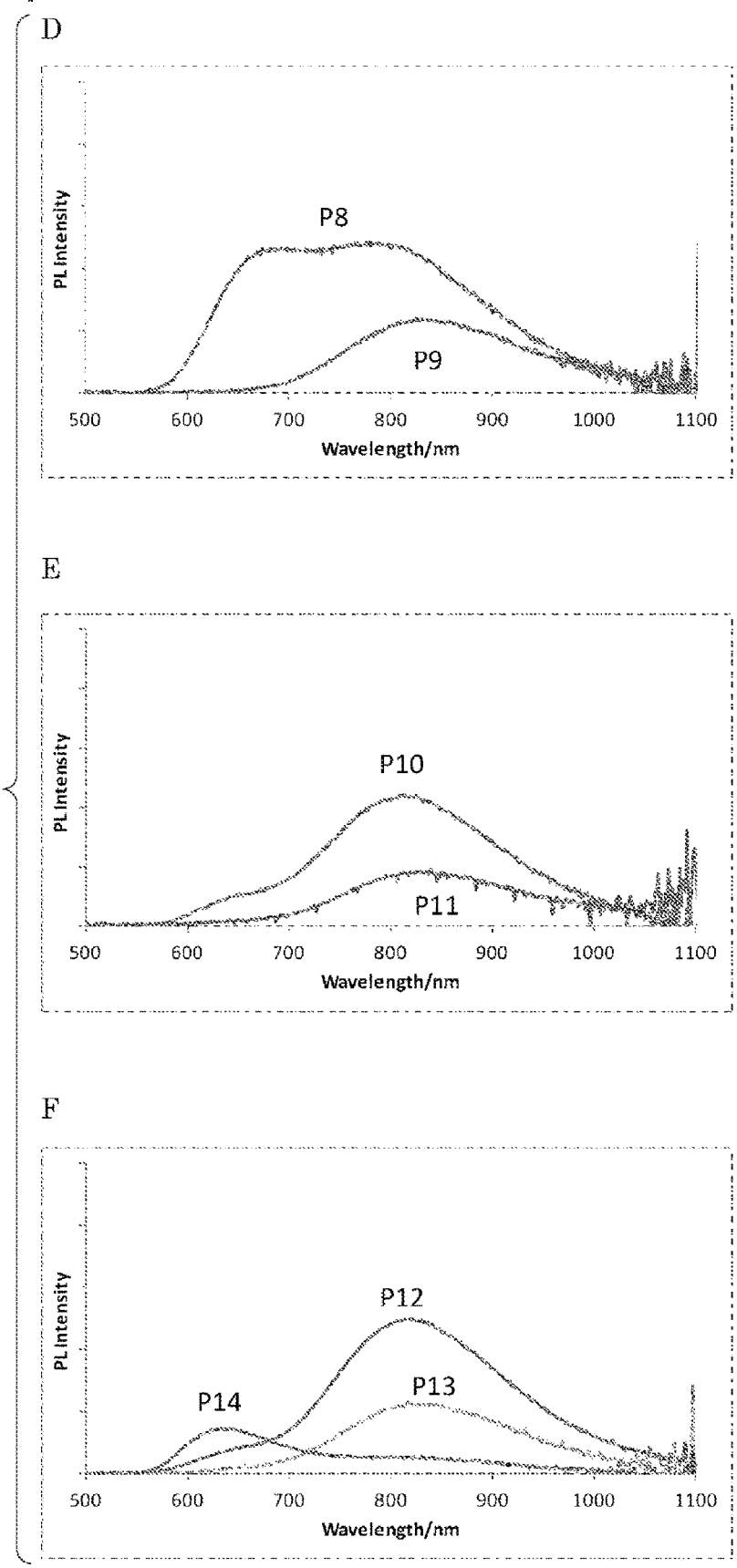
FIG. 4 shows emission spectra of near-infrared phosphors P8-P14 used in the examples. D shows the emission spectra of the near-infrared phosphors P8 and P9. E shows the emission spectra of the near-infrared phosphors P10 and P11. F shows the emission spectra of the near-infrared phosphors P12-14.

FIGS. 3 and 4 show emission spectra of the phosphors P1-P14 mentioned above. In FIGS. 3 and 4, the horizontal axis indicates wavelength (nm) and the vertical axis indicates fluorescence intensity (arbitrary unit). An MCPD-9800 (model 311C) manufactured by Otsuka Electronics Co., Ltd. was used for the spectral measurements. Here, the case of excitation with a xenon lamp spectrally dispersing at 370 nm is shown, but these phosphors can be excited in a wide wavelength range of 300-500 nm, and the same emission spectrum was obtained even when the excitation wavelength was changed. These phosphors have emission peaks (peak wavelengths) in the range of 700-850 nm and have emission spectra over a wide range in the near-infrared region. These phosphors use divalent Eu as luminescent ions and have broad emission spectra with a full width at half maximum of 100 nm or more due to 5d-4f transitions. The luminescent ions of the phosphors further produced are in a plurality of coordination environments and therefore exhibit spectra in which several emission peaks overlap. Due thereto, the emission spectral linewidth is wider than that of conventional 5d-4f transition-type phosphors, and as shown in the present production examples, a full width at half maximum from 100-300 nm could be obtained. The balance of the intensities of the plurality of emission peaks differs depending on the production composition, and although, depending on the composition, some have a maximum peak at 700 nm or less, having sub-peaks that overlap in a wavelength region of 700 nm or more is characteristic.

From the above production examples, a phosphor having the composition $Li_aSr_bLa_cSi_dN_eEu_f$ (wherein a+b+c+d+e+f=100, and $0 \le a \le 8.22$, $0.22 \le b \le 17.33$, $1.12 \le c \le 11.36$, $22.41 \le d \le 38.09$, $49.47 \le e \le 56.09$, and $0.88 \le f \le 1.01$) can be used in the examples of the present invention. However, although set to approximately 1 atm %, the concentration of the luminescent ion Eu can be set to 0.01-10 atm % which is the range generally used in phosphors. By setting to the above design range, it is possible to suppress decreases in the emission intensity, and the phosphor can be more preferably used in light-emitting elements for industrial equipment.

In the following examples, a light-emitting element was fabricated using the phosphor P8 of the production examples described above. This phosphor has a wide emission linewidth and also a high emission intensity, and therefore can be said to be particularly suitable for a light-emitting element. However, it is possible to achieve the objective of the present invention even if a phosphor having another composition is used.

When measured using a spectrometer (light source: xenon lamp spectrally dispersing at 370 nm), the emission spectrum of this near-infrared phosphor P8 was measured as having peak wavelengths at 680±3 and 776±3 nm. The results are shown in FIG. 5.

The following phosphors were used as visible phosphors.
(Visible phosphor A1) Phosphor represented by formula (A1-1) (molecular formula: $C_{24}H_{22}N_2O$), peak wavelength 405 nm±3 nm

[Chem. 2]

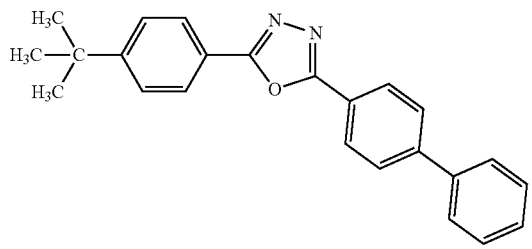

(A1-1)

(Visible phosphor A2) mixture of $Y_2O_2S$:Eu and ZnS:Ag, peak wavelength 424±3 nm
(Visible phosphor B) $BaMgAl_{11}O_{17}$:Eu, peak wavelengths 452±3 nm, 459±3 nm
(Visible phosphor C1-1) $Sr_3SiO_5$:Eu, peak wavelength 520±3 nm
(Visible phosphor C1-2) $Sr_3SiO_5$:Eu, peak wavelength 593±3 nm
(Binder) Silicone resin "KER-1930" manufactured by Shin-Etsu Chemical Co., Ltd.
(Dispersant) Silicone nano powder "REOLOSIL" manufactured by Tokuyama Corporation Example 1

The phosphor powder and the silicone resin shown in Table 4 were mixed at the ratios described in Table 1 using a stirring device to fabricate phosphor resin compositions a-e. The resin composition a was formed into film on a transparent substrate manufactured by SCHOTT Co., Ltd., by sliding a squeegee, provided with a gap between the squeegee and substrate, thermally curing and then peeling from the transparent substrate to form a first layer having a thickness described in Table 1. Next, the resin composition b was formed into a second layer using the same method as that used for the first layer. Furthermore, by the same method, a third layer, a fourth layer, and a fifth layer were formed using, respectively, the resin compositions c, d, and e, and by thinly applying a silicone resin between each layer and stacking the layers, a five-layer fluorescent film was fabricated wherein each layer includes a different one of five kinds of phosphor.

A die attach material made of silver paste was applied to the bottom surface of a recess of a ceramic package having a recess, and an ultraviolet LED chip (1.1 mm×1.1 mm×height of 0.2 mm; current value of 500 mA; and radiant flux of 600 mW or more) having a peak wavelength at 365 nm was mounted thereon. The positive and negative electrodes of the LED chip were connected by gold wires so as to be connected to the respective electrode pads of the positive and negative electrodes of the package. An electrostatic protection element was arranged parallel to the LED chip. The abovementioned fluorescent film was attached to the opening section of the recess of the package with a silicone resin to fabricate a light-emitting device having the structure shown in FIGS. 1 and 2.

TABLE 4

| RESIN COMPOSITION | a (FIRST LAYER) | b (SECOND LAYER) | c (THIRD LAYER) | d (FOURTH LAYER) | e (FIFTH LAYER) |
| --- | --- | --- | --- | --- | --- |
| KIND OF PHOSPHOR | VISIBLE PHOSPHOR A-2 | VISIBLE PHOSPHOR B | VISIBLE PHOSPHOR C1-1 | VISIBLE PHOSPHOR C1-2 | NEAR-INFRARED PHOSPHOR |

TABLE 4-continued

| RESIN COMPOSITION | a (FIRST LAYER) | b (SECOND LAYER) | c (THIRD LAYER) | d (FOURTH LAYER) | e (FIFTH LAYER) |
|---|---|---|---|---|---|
| PHOSPHOR CONTENT (mass %) | 50 | 20 | 20 | 10 | 10 |
| SILICONE RESIN CONTENT (mass %) | 50 | 80 | 80 | 90 | 90 |
| FILM THICKNESS (μm) | 60 | 45 | 70 | 55 | 90 |

Example 2

A light-emitting device was fabricated in the same manner as in Example 1, except that the fluorescent film was fabricated with the compositions and ratios shown in Table 5. The fluorescent film in this light-emitting device has a seven-layer structure in which each separate layer includes one of seven phosphors.

TABLE 5

| RESIN COMPOSITION | a (FIRST LAYER) | b (SECOND LAYER) | c (THIRD LAYER) | d (FOURTH LAYER) | e (FIFTH LAYER) | f (SIXTH LAYER) | g (SEVENTH LAYER) |
|---|---|---|---|---|---|---|---|
| KIND OF PHOSPHOR | VISIBLE PHOSPHOR A-1 | VISIBLE PHOSPHOR A-2 | VISIBLE PHOSPHOR B | VISIBLE PHOSPHOR C1-1 | VISIBLE PHOSPHOR C1-2 | VISIBLE PHOSPHOR C1-3 | NEAR-INFRARED PHOSPHOR |
| PHOSPHOR CONTENT (mass %) | 60 | 35 | 60 | 10 | 33 | 6 | 60 |
| SILICONE RESIN CONTENT (mass %) | 40 | 65 | 40 | 90 | 67 | 94 | 40 |
| FILM THICKNESS (μm) | 195 | 50 | 50 | 55 | 50 | 45 | 50 |

Example 3

A light-emitting device was fabricated in the same manner as in Example 1, except that the fluorescent film was fabricated with the compositions and ratios shown in Table 6. The fluorescent film in this light-emitting device has a three-layer structure in which the visible phosphors A and B are included in separate layers, and a near-infrared phosphor and the visible phosphors C1-1 and C1-2 are included in the same layer.

TABLE 6

| RESIN COMPOSITION | a (FIRST LAYER) | b (SECOND LAYER) | c (THIRD LAYER) | | |
|---|---|---|---|---|---|
| KIND OF PHOSPHOR | VISIBLE PHOSPHOR A-2 | VISIBLE PHOSPHOR B | VISIBLE PHOSPHOR C1-1 | VISIBLE PHOSPHOR C1-2 | NEAR-INFRARED PHOSPHOR |
| PHOSPHOR CONTENT (mass %) | 50 | 20 | 20 | 10 | 10 |
| SILICONE RESIN CONTENT (mass %) | 50 | 80 | 60 | | |
| FILM THICKNESS (μm) | 50 | 45 | 200 | | |

Comparative Example 1

A light-emitting device was fabricated in the same manner as Example 1, except that a near-infrared phosphor is not included.

Comparative Example 2

A light-emitting device was fabricated in the same manner as Example 1, except that a phosphor "BR-101/N" (peak wavelength 648 nm; full width at half maximum 88 nm) manufactured by Mitsubishi Chemical Co., Ltd. was used instead of the near-infrared phosphor.

Emission Spectrum

Figure 7:
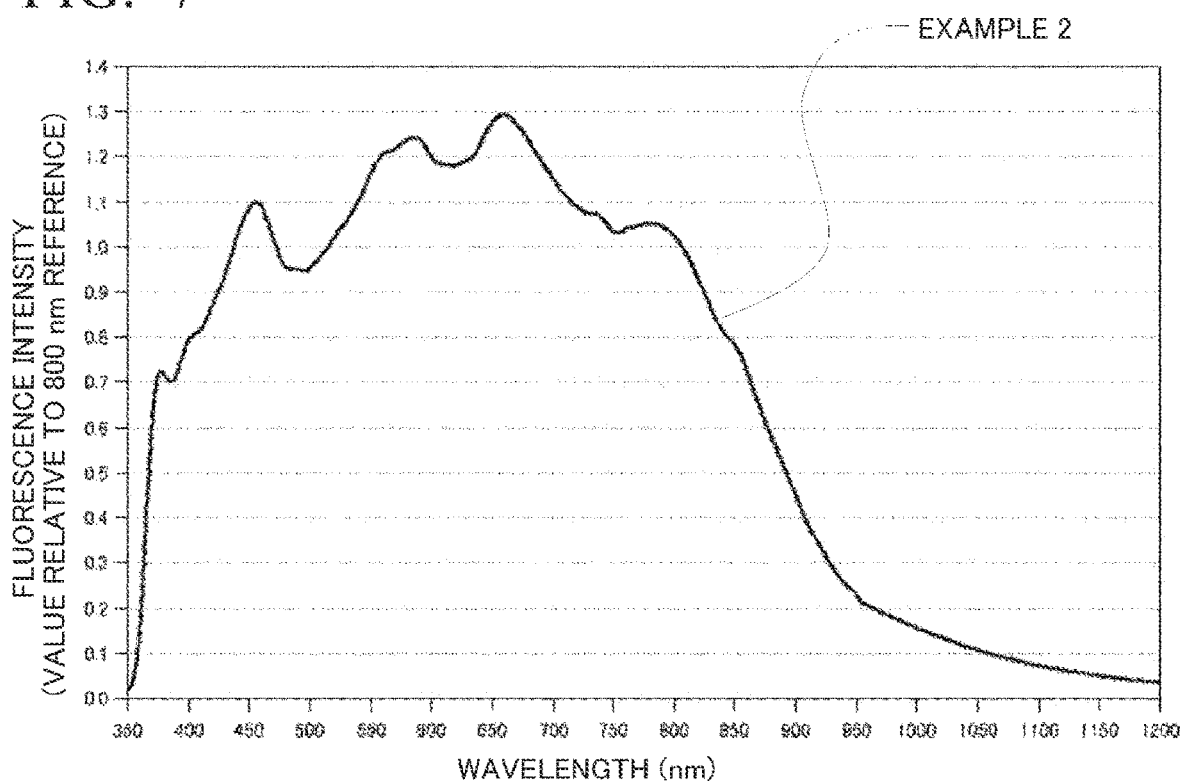
FIG. 7 shows an emission spectrum of the light-emitting device of Example 2.
Figure 8:
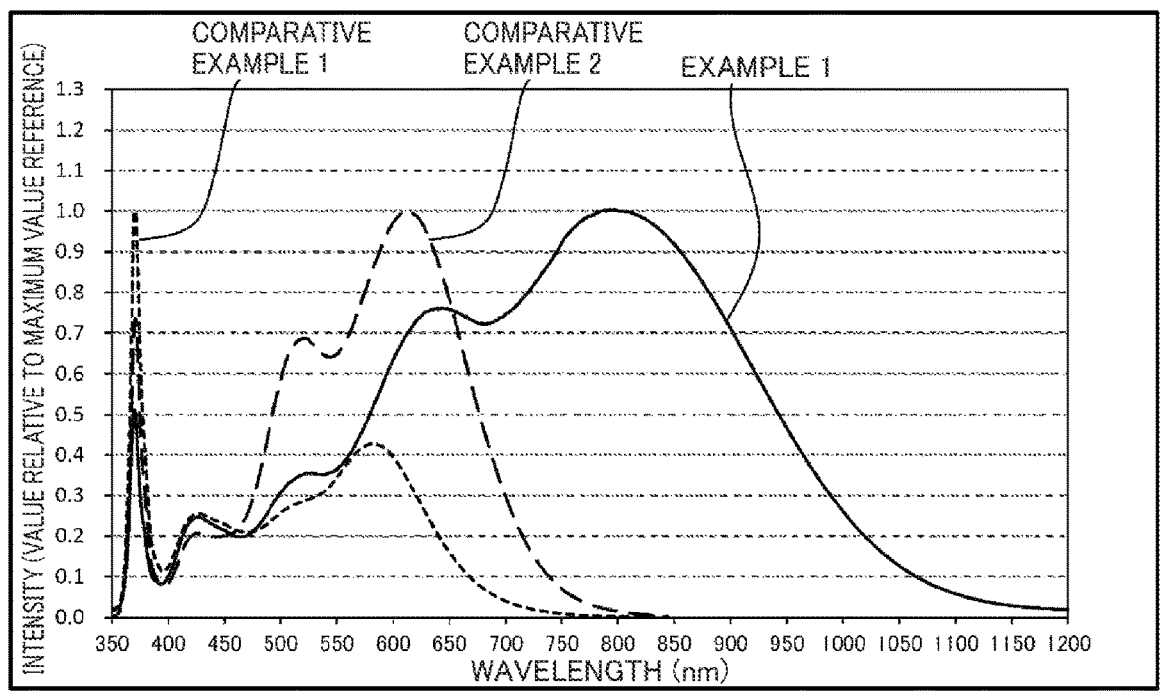
FIG. 8 shows the emission spectra of the light-emitting device of Example 1 and Comparative Examples 1 and 2.

A spectrometer was used to measure the emission spectra of the light-emitting devices of the examples and the comparative examples under conditions of Ta=25° C. and IF=500 mA. The results of Examples 1 and 3 are shown in FIG. 6. The results of Example 2 are shown in FIG. 7. A comparison between Comparative Examples 1 and 2 and Example 1 is shown in FIG. 8.

As shown in FIGS. 6 and 7, the light-emitting devices of Examples 1-3 have peak wavelengths in the region exceeding 780 nm. Among the foregoing, the light-emitting devices of Examples 1 and 3 have, in the region exceeding 780 nm, wavelengths at which a maximum emission intensity is obtained in the continuous emission spectrum.

Further, in the spectrum of Example 1 shown in FIG. 6, the fluorescence intensity at the two ends (350 nm and 1,200 nm) of the continuous spectrum is, respectively, 1.7% and 1.9% with respect to the maximum intensity near 800 nm, and the fluorescence intensity at the minimum point near 390 nm is also 8.2%. Thus, all of the intensities exceed 1.5%. As such, this light-emitting device has a continuous emission spectrum at least in the range of 350 nm or more to 1,200 nm or less. Similarly, it was confirmed that the light-emitting devices of Examples 2 and 3 also have continuous emission spectra at least in a broad bandwidth of 350 nm or more to 1,200 nm.

Furthermore, it was confirmed that a light-emitting device shown in the examples achieves a radiant flux in excess of 10 mW. As such, this light-emitting device has a broad bandwidth emission spectral distribution from the ultraviolet region to the near-infrared region, as well as being excellent in high brightness and high light-harvesting properties. Further, emission responsiveness during energization, temporal variation in emission intensity, and wavelength shift due to temperature, etc., are small and therefore the light-emitting device can be suitably used as a light-emitting device for industrial equipment as an alternative element to a conventional light source (halogen lamps, and the like) which have problems with respect to these characteristics.

REFERENCE SIGNS LIST

10, 100, 101, 102 Light-emitting device
1, 11, 12, 13 Package
2, 21, 22a-22e, 23a-23f Solid-state light source
3, 30, 31, 32a-32e, 33a-33g Fluorescent film
4 Wire
5 Electrode pad
6 Electrostatic protection element

The invention claimed is:

1. A light-emitting device comprising at least a solid-state light source that emits light having a peak wavelength in the range of 480 nm or less and a fluorescent film that covers the solid-state light source and includes at least one kind of phosphor, wherein
the fluorescent film includes at least one kind of near-infrared phosphor that is excited by light from the solid-state light source and emits light having a peak wavelength in the range exceeding 700 nm and having an emission spectrum with a full width at half maximum of 100 nm or more in a range including the peak wavelength,
the light emitting device has a continuous emission spectrum at least in the range of 400 nm or more to 1,000 nm or less, and
the continuous emission spectrum means the emission intensity of the emission spectrum is 0.01 or more, as a value relative to an 800 nm reference, across the entire region within this range.

2. The light-emitting device according to claim 1, wherein the fluorescent film further includes at least one kind of visible phosphor that is excited by light from the solid-state light source and emits light having a peak wavelength in the range of 350 nm or more to 700 nm or less.

3. The light-emitting device according to claim 2, wherein the fluorescent film includes, as the visible phosphor, one or more kinds of each of: a visible phosphor A that is excited by light from the solid-state light source and emits light having a peak wavelength in the range of 350 nm or more to less than 430 nm; a visible phosphor B that is excited by light from the solid-state light source and emits light having a peak wavelength in the range of 430 nm or more to less than 500 nm; and a visible phosphor C that is excited by light from the solid-state light source and emits light having a peak wavelength in the range of 500 nm or more to 700 nm or less.

4. The light-emitting device according to claim 3, wherein the fluorescent film is formed with two or more layers and the visible phosphors A and B are included in different layers.

5. The light-emitting device according to claim 3, wherein
the fluorescent film is formed with two or more layers each having a different kind of phosphor included therein, and
the two or more layers are laminated, in the traveling direction of light from the solid-state light source, in an order from a layer including a phosphor having a longer peak wavelength to a layer including a phosphor having a shorter peak wavelength.

6. The light-emitting device according to claim 4, wherein each layer of the fluorescent film includes one or more and three or less kinds of phosphors.

7. The light-emitting device according to claim 3, wherein the fluorescent film has, on a same surface, two or more regions each having a different kind of phosphor included therein.

8. The light-emitting device according to claim 7, wherein the two or more regions each having a different kind of phosphor have at least a region including the near-infrared phosphor and a region including the visible phosphor.

9. The light-emitting device according to claim 1, comprising two or more of the solid-state light sources.

10. The light-emitting device according to claim 1, wherein the solid-state light source is at least one selected from a light-emitting diode, a laser diode, and an organic electroluminescent light-emitting element.

11. The light-emitting device according to claim 1, wherein the near-infrared phosphor includes divalent europium.

12. A fluorescent film including: at least one kind of near-infrared phosphor that, due to light having a peak wavelength in the range of 480 nm or less, emits light having a peak wavelength in the range exceeding 700 nm and having an emission spectrum with a full width at half maximum of 100 nm or more in a range including the peak wavelength; and at least one kind of visible phosphor that, due to the light, emits light having a peak wavelength in the range of 350 nm or more to 700 nm or less,
wherein the near-infrared phosphor has a composition represented by formula (I)

$$Li_a Sr_b La_c Si_d N_e Eu_f \qquad (I)$$

wherein a-f are numbers satisfying: a+b+c+d+e+f=100; and 0<a≤8.22, 0.22≤b≤17.33, 1.12≤c≤11.36, 22.41≤d≤38.09, 49.47≤e≤56.09, and 0.88≤f≤1.01.